United States Patent
Yin et al.

(10) Patent No.: US 12,062,330 B2
(45) Date of Patent: Aug. 13, 2024

(54) DISPLAY PANEL AND ELECTRONIC DEVICE

(71) Applicant: Wuhan China Star Optoelectronics Semiconductor Display Technology Co., Ltd., Wuhan (CN)

(72) Inventors: Maojun Yin, Wuhan (CN); Shaojing Wu, Wuhan (CN); Cheng Yang, Wuhan (CN); Xiaoguang Zhu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/610,536

(22) PCT Filed: Sep. 18, 2021

(86) PCT No.: PCT/CN2021/119202
§ 371 (c)(1),
(2) Date: Nov. 11, 2021

(87) PCT Pub. No.: WO2023/035313
PCT Pub. Date: Mar. 16, 2023

(65) Prior Publication Data
US 2024/0038153 A1 Feb. 1, 2024

(30) Foreign Application Priority Data
Sep. 10, 2021 (CN) .......................... 202111059470.1

(51) Int. Cl.
*G09G 3/3208* (2016.01)
*H10K 59/131* (2023.01)
*H10K 59/88* (2023.01)

(52) U.S. Cl.
CPC ......... *G09G 3/3208* (2013.01); *H10K 59/131* (2023.02); *H10K 59/88* (2023.02);
(Continued)

(58) Field of Classification Search
CPC ......... G09G 3/3208; G09G 2300/0413; G09G 2320/0233; H10K 59/131; H10K 59/88
See application file for complete search history.

(56) References Cited

U.S. PATENT DOCUMENTS

2021/0225269 A1* 7/2021 Yang .................... H10K 59/121
2022/0376015 A1* 11/2022 Cheng .................. H10K 59/121
(Continued)

FOREIGN PATENT DOCUMENTS

| CN | 110504287 A | 11/2019 |
| CN | 111028692 A | 4/2020 |

(Continued)

OTHER PUBLICATIONS

International Search Report in International application No. PCT/CN2021/119202, mailed on May 26, 2022.
(Continued)

*Primary Examiner* — Hong Zhou
(74) *Attorney, Agent, or Firm* — Nathan & Associates; Menachem Nathan (57) ABSTRACT

The present disclosure provides an electronic device and a display panel. The display panel includes a transition display region and a transparent display region. First pixel driving circuits are placed in the transition display region. Dummy pixel driving circuits are placed in the transition display region. One of the dummy pixel driving circuit is adjacently placed within a predetermined distance from at least one side of the first pixel driving circuits arranged along the second direction. This could reduce the environment difference between the pixel driving circuit close to the light sensing region and the pixel driving circuit inside the transition display region and thus reduce the luminance difference between the first display pixels controlled by the pixel driving circuit close to the light sensing region and the (Continued)

first display pixels controlled by the pixel driving circuit inside the transition display region.

14 Claims, 5 Drawing Sheets (52) U.S. Cl.
CPC ............... *G09G 2300/0413* (2013.01); *G09G 2320/0233* (2013.01)

(56) References Cited

U.S. PATENT DOCUMENTS

2022/0406979 A1\* 12/2022 Wu .......................... G09G 3/20
2023/0117888 A1\* 4/2023 Du ....................... H10K 59/131
345/55

FOREIGN PATENT DOCUMENTS

| CN | 111708199 A | 9/2020 |
| CN | 112562518 A | 3/2021 |
| CN | 213878097 U | 8/2021 |
| WO | 2018038814 A1 | 3/2018 |

OTHER PUBLICATIONS

Written Opinion of the International Search Authority in International application No. PCT/CN2021/119202, mailed on May 26, 2022.

\* cited by examiner

DISPLAY PANEL AND ELECTRONIC DEVICE

FIELD OF THE DISCLOSURE

The present disclosure relates to a display technology, and more particularly, to a display panel and an electronic device.

BACKGROUND

As the progress of the display technology, the OLED (organic light emitting diode) display panel becomes one of the most common display panels of a smart phone and the appearance gradually becomes a full-screen (high screen-to-body ratio). In order to raise the screen-to-body ratio, the camera under panel (CUP) technology is the focus of the display panel manufacturers and the smart terminal products using CUP technology have entered the consuming product market.

In the conventional display panel adopting the CUP technology, in order to raise the image effect of the camera, the pixel array in the display region and the light sensing region of the CUP in the display panel are separated such that the transparency of the display panel portion above the camera could be raised and thus the light collecting ability of the camera could be raised. Because the pixel array is divided, the pixel driving circuit located at the edge of the pixel array, which close to the light sensing region, and the pixel driving circuit inside the pixel array have different environments. As a result, the electrical signal of the TFT in the pixel driving circuit close to the light sensing region is different from the electrical signal of the TFT of the pixel driving circuit inside the pixel array. This changes the lighting unit controlled by the pixel driving circuit at the edge of the pixel array, which is close to the light sensing region. Accordingly, the luminance of the pixel array at the edge of the light sensing region and the luminance inside the pixel array become different.

From the above, the conventional display panel and the electronic device have an issue of uneven luminance on the CUT region. Therefore, a display panel and an electronic device need to be developed to solve this issue.

SUMMARY

One objective of an embodiment of the present disclosure is to provide a display panel and an electronic device to solve the issue of uneven luminance on the CUT region.

According to an embodiment of the present disclosure, a display panel is disclosed. The display panel has an additional function region comprising a transition display region and a transparent display region. The transition display region is placed in a peripheral region of the transparent display region. The display panel comprises: a plurality of display pixels, placed in the transition display region and the transparent display region; a plurality of first pixel driving circuits, placed in the transition display region, each of the plurality of first pixel driving circuits is electrically connected to at least one corresponding first display pixel of the plurality of display pixels; and a plurality of dummy pixel driving circuits, placed in the transition display region; wherein the plurality of display pixels extend along a first direction as a column, the first pixel driving circuit are arranged along a second direction, and the first direction and the second direction are different and wherein a first pixel driving circuit or a dummy pixel driving circuit is adjacently placed within a predetermined distance from at least one side of at least part of the first pixel driving circuits arranged along the second direction.

According to an embodiment of the present disclosure, the display panel comprises a plurality of data lines, extending along the first direction and distributed along the second direction. A part of the plurality of dummy pixel driving circuits located in a same column is electrically connected to a same data line. A column of the dummy pixel driving circuits and an adjacent column of the first pixel driving circuits are respectively electrically connected to two adjacent data lines.

According to an embodiment of the present disclosure, the transition display region has m first pixel driving circuits and m data lines, an $n^{th}$ column of the first pixel driving circuits is electrically connected to an $n^{th}$ data line. A column of the dummy pixel driving circuits is placed within a predetermined distance from one side of the $n^{th}$ column of the first pixel driving circuits, the dummy pixel driving circuits are electrically connected to a data line other than the $n^{th}$ data line where n is greater than or equal to 1 and is smaller than or equal to m.

According to an embodiment of the present disclosure, the plurality of dummy pixel driving circuits comprises a first dummy pixel driving circuit and a second dummy pixel driving circuit. A column of the first dummy pixel driving circuit is placed at a side of the $n^{th}$ column of the first pixel driving circuit close to an $(n+1)^{th}$ column of the first pixel driving circuit, the first dummy pixel driving circuit is electrically connected to an $a^{th}$ data line. A column of the first dummy pixel driving circuit is placed at a side of the $(n+1)^{th}$ column of the first pixel driving circuit close to the $n^{th}$ column of the first pixel driving circuit, the second dummy pixel driving circuit is electrically connected to a $b^{th}$ data line, wherein n is greater than or equal to (m−1), a is greater than or equal to (n+1) and b is smaller than or equal to n.

According to an embodiment of the present disclosure, each column of the dummy pixel driving circuits and its adjacent column of the first pixel driving circuit are respectively electrically connected to adjacent data lines, wherein a is equal to (n+1) and b is equal to n.

According to an embodiment of the present disclosure, the plurality of dummy pixel driving circuit comprises a first dummy pixel driving circuit and a second dummy pixel driving circuit. A column of the first dummy pixel driving circuit is placed at a side of the $n^{th}$ column of the first pixel driving circuit close to an $(n+1)^{th}$ column of the first pixel driving circuit, the first dummy pixel driving circuit is electrically connected to an $a^{th}$ data line. A column of the first dummy pixel driving circuit is placed at a side of the $(n+1)^{th}$ column of the first pixel driving circuit close to the $n^{th}$ column of the first pixel driving circuit, the second dummy pixel driving circuit is electrically connected to a $b^{th}$ data line, where n is greater than or equal to (m−1), a is smaller than or equal to (n−1) and b is greater than or equal to (n+2).

According to an embodiment of the present disclosure, each column of the dummy pixel driving circuits and its adjacent column of the first pixel driving circuit are respectively electrically connected to adjacent data lines, where a is equal to (n−1) and b is equal to (n+2).

According to an embodiment of the present disclosure, the plurality of dummy pixel driving circuits extend along the first direction as a column, at least one column of the dummy pixel driving circuit is adjacently placed within a predetermined distance from a side of at least two columns of a plurality of columns of first driving circuits arranged along the second direction.

According to an embodiment of the present disclosure, the transition display region has a plurality of pixel driving circuit islands arranged in an interval distribution, each of the pixel driving circuit islands comprises multiple first pixel driving circuits. A distance between two adjacent pixel driving circuit islands is greater than the predetermined distance. A corresponding column of the dummy pixel driving circuit is placed at one side edge of a pixel driving circuit island along the second direction, where the side edge of the pixel driving circuit island along the second direction is closer to its adjacent pixel driving circuit. A column of the first pixel driving circuit in the pixel driving circuit island closest to its adjacent pixel driving circuit and a corresponding dummy pixel driving circuit are respectively electrically connected to two adjacent data lines.

According to an embodiment of the present disclosure, each of the first pixel driving circuits is electrically connected to a plurality of the first display pixels.

According to an embodiment of the present disclosure, along the second direction, a corresponding column of the dummy driving circuit is placed between a column of the first pixel driving circuit in the transition display region closest to the transparent display region and the display region. A column of the first pixel driving circuit in the transition display region closest to the transparent display region and a corresponding column of the dummy pixel driving circuit are respectively electrically connected to two adjacent data lines.

According to an embodiment of the present disclosure, along the second direction, a column of the dummy pixel driving circuit placed at one side of the transparent display region is electrically connected to a data line corresponding to a column of the first pixel driving circuit placed at another side of the transparent display region.

According to an embodiment of the present disclosure, along the second direction, a column of the dummy pixel driving circuit placed at one side of the transparent display region is electrically connected to a data line corresponding to a column of the first pixel driving circuit placed at another side of the transparent display region closest to the transparent display region.

According to an embodiment of the present disclosure, the first pixel driving circuits and the first display pixels are one-by-one electrically connected to each other.

According to an embodiment of the present disclosure, the display panel has a main display region placed in a peripheral region of the additional function region. The display panel further comprises: a plurality of second display pixels placed in the main display region, and a plurality of second pixel driving circuits, placed in the main display region, the second pixel driving circuits are electrically connected to the corresponding second display pixels. A density of the first pixel driving circuits in the transition display region is greater than a density of the second pixel driving circuits in the main display region.

According to an embodiment of the present disclosure, an electronic device comprising an optical sensor and a display panel is provided. The display panel has an additional function region, comprising a transition display region and a transparent display region. The transition display region is placed in a peripheral region of the transparent display region. The display panel comprises: a plurality of display pixels, placed in the transition display region and the transparent display region; a plurality of first pixel driving circuits, placed in the transition display region, each of the plurality of first pixel driving circuits is electrically connected to at least one corresponding first display pixel of the plurality of display pixels; and a plurality of dummy pixel driving circuits, placed in the transition display region; wherein the plurality of display pixels extend along a first direction as a column, the first pixel driving circuit are arranged along a second direction, and the first direction and the second direction are different and wherein a first pixel driving circuit or a dummy pixel driving circuit is adjacently placed within a predetermined distance from at least one side of at least part of the first pixel driving circuits arranged along the second direction.

According to an embodiment of the present disclosure, the display panel comprises a plurality of data lines, extending along the first direction and distributed along the second direction. A part of the plurality of dummy pixel driving circuits located in a same column is electrically connected to a same data line. A column of the dummy pixel driving circuits and an adjacent column of the first pixel driving circuits are respectively electrically connected to two adjacent data lines.

According to an embodiment of the present disclosure, the transition display region has m first pixel driving circuits and m data lines, an $n^{th}$ column of the first pixel driving circuits is electrically connected to an $n^{th}$ data line. A column of the dummy pixel driving circuits is placed within a predetermined distance from one side of the $n^{th}$ column of the first pixel driving circuits, the dummy pixel driving circuits are electrically connected to a data line other than the $n^{th}$ data line where n is greater than or equal to 1 and is smaller than or equal to m.

According to an embodiment of the present disclosure, the plurality of dummy pixel driving circuits comprises a first dummy pixel driving circuit and a second dummy pixel driving circuit. A column of the first dummy pixel driving circuit is placed at a side of the $n^{th}$ column of the first pixel driving circuit close to an $(n+1)^{th}$ column of the first pixel driving circuit, the first dummy pixel driving circuit is electrically connected to an $a^{th}$ data line. A column of the first dummy pixel driving circuit is placed at a side of the $(n+1)^{th}$ column of the first pixel driving circuit close to the $n^{th}$ column of the first pixel driving circuit, the second dummy pixel driving circuit is electrically connected to a $b^{th}$ data line, wherein n is greater than or equal to (m−1), a is greater than or equal to (n+1) and b is smaller than or equal to n.

According to an embodiment of the present disclosure, each column of the dummy pixel driving circuits and its adjacent column of the first pixel driving circuit are respectively electrically connected to adjacent data lines, wherein a is equal to (n+1) and b is equal to n.

According to an embodiment of the present disclosure, a display panel and an electronic device are disclosed. The display panel includes an additional function region. The additional function region comprises a transition display region and a transparent display region. The transition display region is placed in a peripheral region of the transparent display region. The transition display region has a plurality of first pixel driving circuits and a plurality of dummy pixel driving circuits. Each of the plurality of first pixel driving circuits is electrically connected to at least one corresponding first display pixel. In each column of first pixel driving circuits, a first pixel driving circuit or a dummy pixel driving circuit is adjacently placed within a predetermined distance from at least one side of at least part of the first pixel driving circuits arranged along the second direction. This could reduce the environment difference between the pixel driving circuit close to the light sensing region and the pixel driving circuit inside the transition display region and thus reduce the luminance difference between the first display pixels controlled by the pixel driving circuit close to the light sensing region and the first display pixels controlled by the pixel driving circuit inside the transition display region. Accordingly, the display panel and the electronic device could solve the issue of uneven luminance in the additional function region.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

According to an embodiment of the present disclosure, a display panel and an electronic device are disclosed. The electronic device comprises the display panel. In an embodiment, the electronic device could be a mobile terminal, such as a smart phone, a tablet, or a laptop. The electronic device could be a wearable terminal, such as a smart watch, a smart bracelet, smart glasses, or a dummy reality equipment. In addition, the electronic device could be a fixed terminal, such as a personal computer or a TV.

Figure 1:
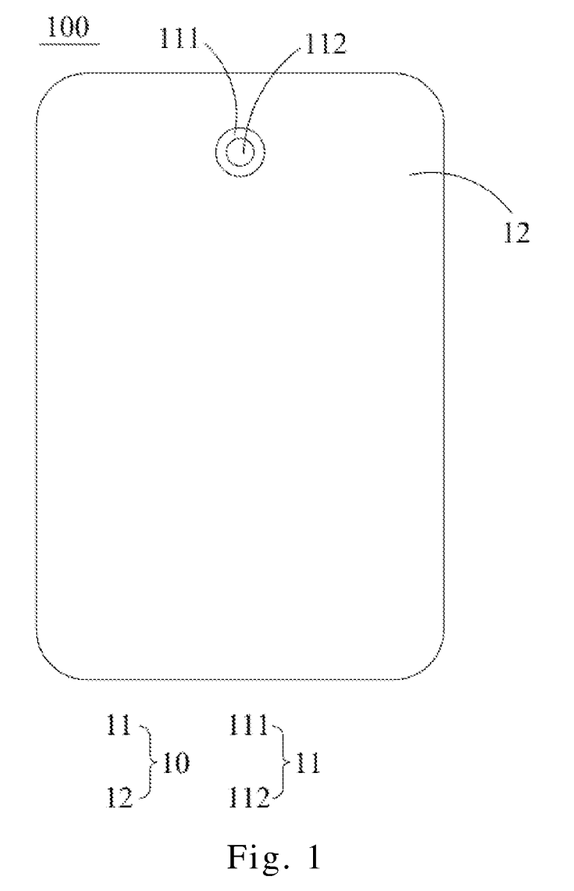
FIG. 1 is a diagram of a display panel according to an embodiment of the present disclosure.

Please refer to FIG. 1. FIG. 1 is a diagram of a display panel according to an embodiment of the present disclosure. The display panel 100 comprises a display region 10. The display region 10 could be used to display images.

The display region 10 could comprise an additional function region 11 and a main display region 12. The main display region 12 is placed in the peripheral region of the additional function region 11. The additional function region could work with the main display region 12 to display images such that the display panel 100 could have a full-screen display effect. In addition, the additional function region 11 could be used as a transparent region such that an optical sensor, which is placed according to the position of the additional function region 11, could receive light through the transparent region.

The display region 10 only has one additional function region 11. The additional functional region 11 could be placed in any region of the display region 10. In the actual implementation, the number of the additional function region 11 in the display region 10 is not limited to be 1. Instead, the number could be greater than or equal to 2. When the display region 10 has multiple additional function regions 11, each of the additional function region 11 could have the same sensing function or a different sensing function other than the displaying function. These additional function regions could be put together or could be positioned separately.

The optical sensor could be a camera. In this way, the CUT function could be achieved while the screen-to-body ratio of the display panel is raised. In the actual implementation, the type of the optical sensor is not limited to the above-mentioned camera. It could include, but not limited to, a fingerprint sensor, an IR sensor, and/or a laser sensor.

The additional function region 11 comprises a transition display region 111 and a transparent display region 112. The transition display region 111 is placed in a peripheral region of the transparent display region 111.

The transition display region 111 is in a ring shape and the transparent region 112 is in a round shape. In the actual implementation, the shape of the transparent display region 112 is not limited to the round shape. The transparent display region 112 could be in a shape of a rectangular shape, a rectangular with rounded corners, or an irregular polygon.

Figure 2:
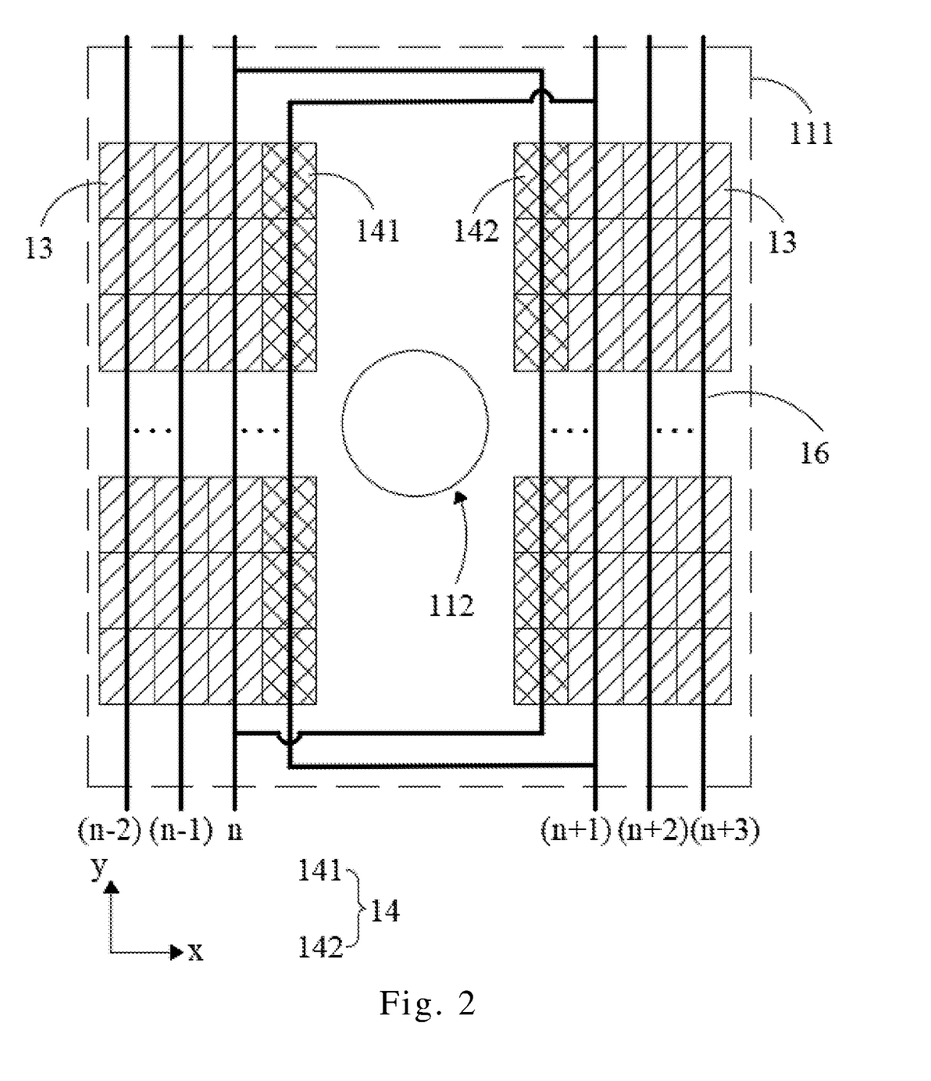
FIG. 2 is a diagram of an additional function region according to a first embodiment of the present disclosure.

Please refer to FIG. 2. FIG. 2 is a diagram of an additional function region according to a first embodiment of the present disclosure. The display panel 100 further comprises a plurality of first display pixels and a plurality of first pixel driving circuits 13. The first display pixels could be placed in the transition display region 111 and the transparent display region 112. The first driving circuits 13 are used to drive the first display pixels in the transition display region 111 and the transparent display region 112 such that the transition display region 111 and the transparent display region 112 could both display images.

The first pixel driving circuits 13 are placed in the transition display region 111 to ensure that the transparent display region 112 does not need to have any first pixel driving circuit 13. In this way, it could avoid the light reflection from the metal layer film or other non-transparent film of the first pixel driving circuit 13 such that the transparent rate of the transparent region 112 could be raised Each of the first pixel driving circuits 13 is electrically connect to one corresponding first display pixel of the first display pixels to drive the corresponding first display pixel to generate light. In the actual implementation, each of the first pixel driving circuits 13 is not limited to be electrically connected to only one first display pixel. Each of the first pixel driving circuits 13 could be electrically connected to two or more first display pixels to drive the two or more first display pixels to generate light.

The additional function region 11 only has one transparent display region 112. The optical sensor is placed correspondingly to the transparent display region 112 of the additional function region 11. In the actual implementation, if the display panel 100 comprises a plurality of optical sensors, the additional function region 11 could have a plurality of separately-placed transparent display regions 112.

Each of the first pixel driving circuits 13 comprises devices and wires. The devices could comprise switches and capacitors. The wire could comprise signal lines. The switches could comprise thin film transistors (TFTs) or diodes.

Each of the first display pixels could comprise a first red sub-pixel, a first green sub-pixel and a first blue sub-pixel. The first red sub-pixel, the first green sub-pixel and the first blue sub-pixel are all OLEDs. In the actual implementation, the first red sub-pixel, the first green sub-pixel and the first blue sub-pixel are not necessary to be OLEDs. They could be mini-LEDs or micro-LEDs.

The main display region 12 comprises a plurality of second display pixels and a plurality of pixel driving circuits. The second pixel driving circuits are electrically connected to corresponding second display pixels to drive the corresponding second display pixels to generate light.

Each of the second display pixel could comprise a second red sub-pixel, a second green sub-pixel and a second blue sub-pixel. The second red sub-pixel, the second green sub-pixel and the second blue sub-pixel are all OLEDs. In the actual implementation, the second red sub-pixel, the second green sub-pixel and the second blue sub-pixel are not necessary to be OLEDs. They could be mini-LEDs or micro-LEDs.

Each of the first pixel driving circuits 13 comprises devices and wires. The devices could comprise switches and capacitors. The wire could comprise signal lines. The switches could comprise TFTs or diodes.

In this embodiment, the density of the first display pixels in the transparent display region 112 could be smaller than the density of the second display pixels in the main display region 12; and/or the distance between any two adjacent first display pixels in the transparent display region is greater than any two adjacent second display pixels in the main display region 12; and/or the size of the first display pixels in the transparent display region 112 could be smaller than the size of the second display pixels in the main display region 12 such that the transparency of the transparent display region 112 is greater than the transparency of the main display region 12.

The density of the first pixel driving circuits 13 in the transition display region 111 is greater than the density of the second pixel driving circuits in the main display region 12. In this way, the first pixel driving circuits, which might be originally placed in the transparent display region 112, could be all placed in the transition display region 111 such that the transparency of the transparent display region 112 could be raised.

The first pixel driving circuits 13 in the transition display region 111 extend along the first direction y to be columns. These columns of the first pixel driving circuits 13 are arranged along the second direction x. The first direction y is different from the second direction x.

In this embodiment, the first direction y is perpendicular to the second direction x. in the actual implementation, the first direction y could cross the second direction x without being perpendicular to the second direction x.

The display panel further comprises a plurality of dummy pixel driving circuits 14. The dummy pixel driving circuits 14 are placed in the transition display region 11. In each of the columns of the first driving circuits 13, a first pixel driving circuit or a dummy pixel driving circuit is adjacently placed within a predetermined distance from at least one side of at least part of the first pixel driving circuits arranged along the second direction.

Figure 3:
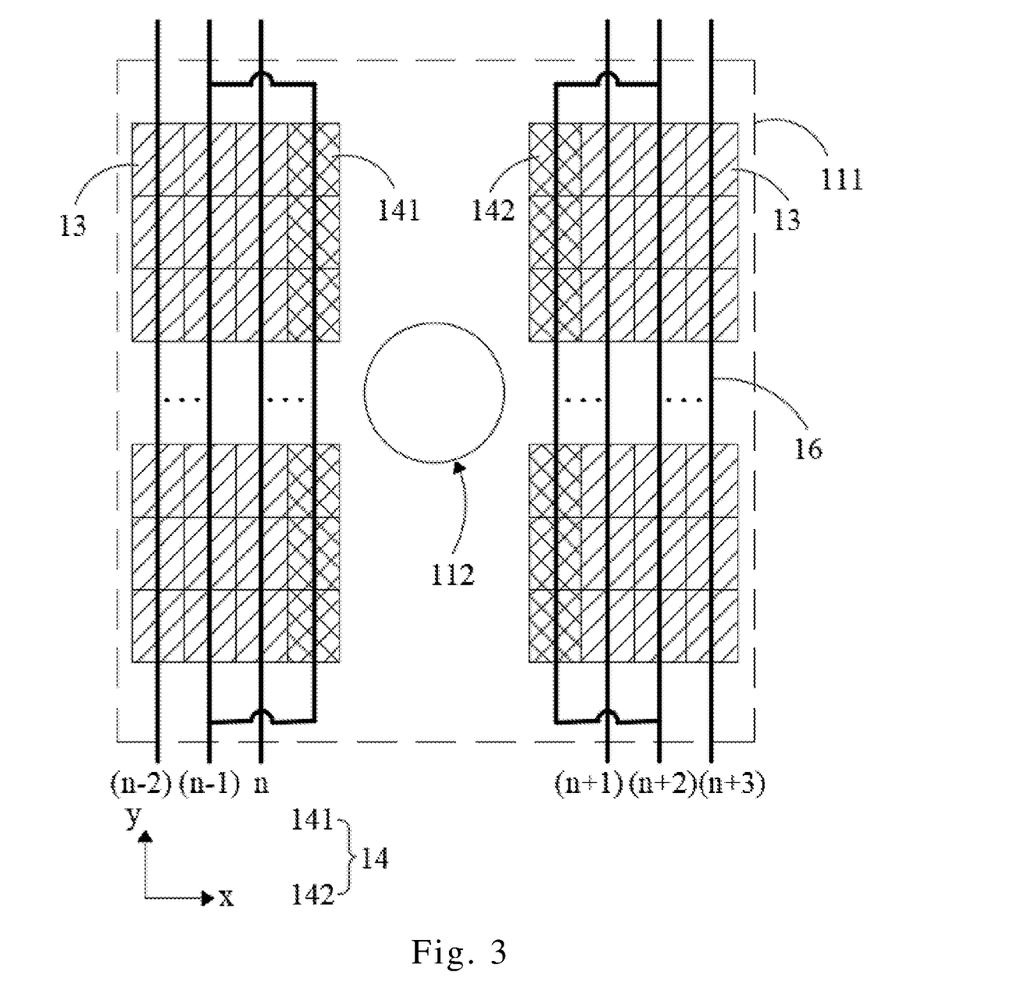
FIG. 3 is a diagram of an additional function region according to a second embodiment of the present disclosure.
Figure 4:
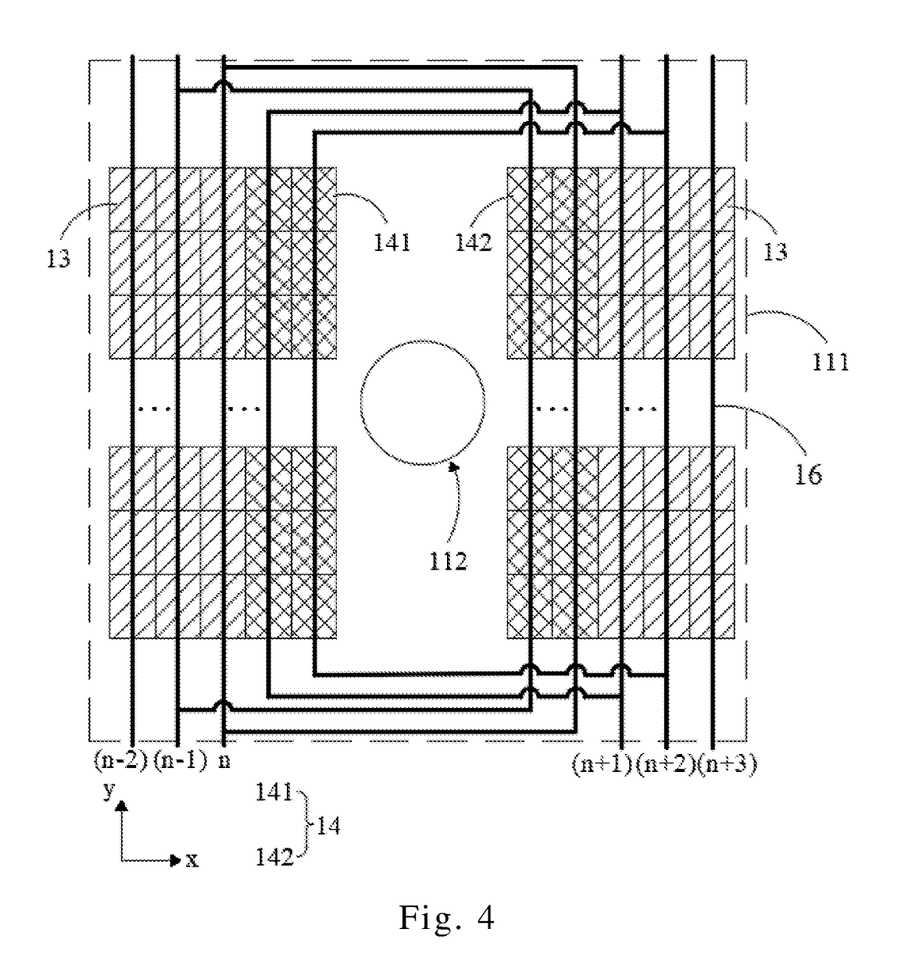
FIG. 4 is a diagram of an additional function region according to a third embodiment of the present disclosure.

The predetermined distance represents the distance between the middle lines of adjacent two columns of the first pixel driving circuits 13 or the distance between the same sides of the adjacent two columns of the first pixel driving circuits. FIG. 2-FIG. 4 uses multiple rectangles to represent the first pixel driving circuits 13 and the dummy pixel driving circuits 14 but this doesn't mean that the shape of the first pixel driving circuits 13 and the dummy pixel driving circuits 14 needs to be rectangular. In addition, FIG. 2-FIG. 4 depicts the arrangement of the first pixel driving circuits 13 and the dummy pixel driving circuits 14 but the depicted arrangement does not limit the number of the first pixel driving circuits 13 and the dummy pixel driving circuits 14.

Take the additional function region 11 shown in FIG. 2 as an example. The transition display region has m columns of the first pixel driving circuits 13. Here, m is an integer greater than or equal to 6. FIG. 2 merely depicts orderly-arranged the $(n-2)^{th}$ column, the $(n-1)^{th}$ column and the $n^{th}$ column and orderly-arranged the $(n+1)^{th}$ column, the $(n+2)^{th}$ column and the $(n+3)^{th}$ column of the first pixel driving circuits 13. The dummy pixel driving circuits 14 comprise a first dummy pixel driving circuit 141 and a second dummy pixel driving circuit 142.

In the $(n-1)^{th}$ column of the first pixel driving circuits 13, a first pixel driving circuit 13 is placed, within the predetermined distance, on the left side of each of the first pixel driving circuits 13 in the second direction x. In addition, a first pixel driving circuit 13 is placed, within the predetermined distance, on the right side of each of the first pixel driving circuits 13 in the second direction x. In the $n^{th}$ column of the first pixel driving circuits 13, a dummy pixel driving circuit 14 is placed, within the predetermined distance, on the left side of each of the first pixel driving circuits 13 in the second direction x.

In the $(n+1)^{th}$ column of the first pixel driving circuits 13, a second pixel driving circuit 142 is placed, within the predetermined distance, on the left side of each of the first pixel driving circuits 13 in the second direction x. In addition, a first pixel driving circuit 13 is placed, within the predetermined distance, on the right side of each of the first pixel driving circuits 13 in the second direction x.

When the additional function region 11 does not have the transparent display region 112, the $n^{th}$ column of the first pixel driving circuit 13 is adjacent to the $(n+1)^{th}$ column of the first pixel driving circuits 13. Furthermore, the $n^{th}$ column of the first pixel driving circuit 13 has a first pixel driving circuit 13 at its right side and the left side in the second direction x such that the $n^{th}$ column of the first pixel driving circuits 13 and the $(n+1)^{th}$ column of the first pixel driving circuits 13 have the same environment. That is, the coupling capacitor of the $n^{th}$ column of the first pixel driving circuits 13 and the influence from signal drop of the adjacent first pixel driving circuit 13 are similar to those of the $(n+1)^{th}$ column of the first pixel driving circuits 13. In this case, the luminance of the first display pixels controlled by the $n^{th}$ column of the first pixel driving circuits 13 is identical or similar to the luminance of the first display pixels controlled by the $(n+1)^{th}$ column of the first pixel driving circuits 13.

Based on the same reason, the luminance of the first display pixels controlled by the $(n+1)^{th}$ column of the first pixel driving circuits 13 is identical or similar to the luminance of the first display pixels controlled by the $(n+2)^{th}$ column of the first pixel driving circuits 13. In this case, the display panel could have a consistent luminance in the additional function region 11.

If the transparent display region 112 is included, because the transparent display region cannot have any first pixel driving circuit 13 in it, the transparent display region 112 separates a part of the $n^{th}$ column of the first pixel driving circuits 13 from a part of the $(n+1)^{th}$ column of the first pixel driving circuits 13. Because the transparent display region 112 does not have any first pixel driving circuit 13, this means that there is no pixel driving circuit 13 on the right side of the $n^{th}$ column of the first pixel driving circuits 13 and on the left side of the $(n+1)^{th}$ column of the first pixel driving circuits 13. This causes the $n^{th}$ column of the first pixel driving circuits 13 and the $(n+1)^{th}$ column of the first pixel driving circuits 13 to have different environments and thus the luminance difference between the $n^{th}$ column of the first pixel driving circuits 13 and the $(n+1)^{th}$ column of the first pixel driving circuits 13 increases. This introduces the luminance unevenness in the additional function region 11 of the display panel 100.

By placing the first dummy pixel driving circuits 141 within the predetermined distance on the right side of each of the first pixel driving circuits 13 in the $n^{th}$ column of the first pixel driving circuits 13 and placing the second dummy pixel driving circuits 142 within the predetermined distance on the left side of each of the first pixel driving circuits in the $(n+1)^{th}$ column of the first pixel driving circuits 13, the first dummy pixel driving circuits 141 and the second dummy pixel driving circuits 142 could receive the data signal and the scan signal as well as the first pixel driving circuits 13. However, the first dummy pixel driving circuits 141 and the second dummy pixel driving circuits 132 do not control any first display pixels. In this way, the $n^{th}$ column of the first pixel driving circuits 13 have pixel driving circuits on its both sides and the $(n+1)^{th}$ column of the first pixel driving circuits 13 also have pixel driving circuits on its both sides. Accordingly, the environment difference between the $n^{th}$ column of the first pixel driving circuits 13 and the $(n-1)^{th}$ column of the first pixel driving circuits 13 is reduced. The environment difference between the $(n+1)^{th}$ column of the first pixel driving circuits 13 and the $(n+2)^{th}$ column of the first pixel driving circuits 13 is reduced. This could avoid huge influences on the signals in the $n^{th}$ column of the first pixel driving circuits 13 and the $(n+1)^{th}$ column of the first pixel driving circuits 13 and thus alleviate the luminance unevenness in the additional function region. Therefore, the display effect of the additional function region 11 is ensured.

The display panel further comprises a plurality of data lines 16. The data lines 16 extend along the first direction y and periodically arranged in the second direction x. The dummy pixel driving circuits 14 extend along the first direction as columns. The dummy pixels driving circuits 14 in a column are connected to the same data line 16.

At least two columns of these columns of the first pixel driving circuits 13 have at least one column of dummy pixel driving circuits 14 within the predetermined distance from a side along the second direction x. A column of the dummy pixel driving circuits 14 and the adjacent column of the first pixel driving circuits are respectively electrically connected to two adjacent data lines 16.

In the transition display region 111, along the second direction x, a corresponding column of the first dummy pixel driving circuits 141 is placed between the transparent display region 112 and the $n^{th}$ column of the first pixel driving circuits 13, which is closest to the transparent display region 112. The dummy pixel driving circuits 141 in the column are all connected to the same data line. Similarly, a corresponding column of the second dummy pixel driving circuits 142 is placed between the transparent display region 112 and the $(n+1)^{th}$ column of the first pixel driving circuits 13, which is closest to the transparent display region 112. The second dummy pixel driving circuits 142 in the column are all connected to the same data line 16.

Along the second direction x, the column of the dummy pixel driving circuits 14 at one side of the transparent display region 112 and the column of the first pixel driving circuits 13 at the other side of the transparent display region 112 are both connected to the same data line 16.

As shown in FIG. 2, the $n^{th}$ column of the first pixel driving circuits 13 is electrically connected to the corresponding $n^{th}$ data line. The $(n+1)^{th}$ column of the first pixel driving circuits 13 is electrically connected to the corresponding $(n+1)^{th}$ data line. Along the second direction x, the column of the first dummy pixel driving circuits 141 at the left side of the transparent display region 112 bypasses the transparent region 112 through the signal wire and is connected to the $(n+1)^{th}$ data line corresponding to the column of the $(n+1)^{th}$ column of the first pixel driving circuits 13 on the right side of the transparent display region 112, which is closest to the transparent display region 112. Along the second direction x, the column of the second dummy pixel driving circuits 141 at the right side of the transparent display region 112 bypasses the transparent region 112 through the signal wire and is connected to the $n^{th}$ data line corresponding to the column of the $n^{th}$ column of the first pixel driving circuits 13 on the left side of the transparent display region 112, which is closest to the transparent display region 112.

In the actual implementation, the transition display region 111 could have m data lines 16. Here, the number m is an integer greater than or equal to 6. FIG. 6 only depicts the $(n-2)^{th}$ data line, the $(n-1)^{th}$ data line, the $n^{th}$ data line, the $(n+1)^{th}$ date line, the $(n+2)^{th}$ data line and the $(n+3)^{th}$ data line 16. A column of the first dummy pixel driving circuits 141 at the right side of the $n^{th}$ column of the first pixel driving circuits 13 could bypass the transparent display region 112 through the signal wire and is connected to the $a^{th}$ data line at the other side of the transparent region 112. Here, the number a is greater than or equal to $(m+1)$ and smaller than or equal to m. When $a=n+1$, a column of the first dummy pixel driving circuits 141 located at the right side of the $n^{th}$ column of the first pixel driving circuits 13 could be connected to the $(n+1)^{th}$ date line along with the $(n+1)^{th}$ column of the first pixel driving circuits 13. When $a=n+2$ or $a=n+3$, a column of the first dummy pixel driving circuits 141 located at the right side of the $n^{th}$ column of the first pixel driving circuits 13 could be connected to the $(n+2)^{th}$ date line or the $(n+3)^{th}$ date line.

A column of the second dummy pixel driving circuits 142 at the left side of the $(n+1)^{th}$ column of the first pixel driving circuits 13 could be connected to the $b^{th}$ data line at the other side of the transparent region 112. Here, the number b is greater than or equal to 1 and smaller than or equal to n. When $b=n$, a column of the second dummy pixel driving circuits 142 located at the left side of the $(n+1)^{th}$ column of the first pixel driving circuits 13 could be connected to the $n^{th}$ date line along with the $n^{th}$ column of the first pixel driving circuits 13. When $b=n-1$ or $b=n-2$, a column of the second dummy pixel driving circuits 142 located at the right side of the $(n+1)^{th}$ column of the first pixel driving circuits 13 could be connected to the $(n-1)^{th}$ date line or the $(n-2)^{th}$ date line. In this way, the $n^{th}$ column of the first pixel driving circuits 13 and the $(n+1)^{th}$ column of the first pixel driving circuits 13 have similar environment as if the $n^{th}$ column of the first pixel driving circuits 13 and the $(n+1)^{th}$ column of the first pixel driving circuits 13 with no transparent display region 112 is placed. Accordingly, the signal in the $n^{th}$ column of the first pixel driving circuits 13 and the $(n+1)^{th}$ column of the first pixel driving circuits 13 will not be largely affected and thus the luminance unevenness in the additional function region 11 is improved.

A column of the dummy pixel driving circuits at one side of the transparent display region 112 could be electrically connected to a data line corresponding to a column of the first pixel driving circuits 13 at the same side of the transparent display region.

In one embodiment, please refer to FIG. 3. FIG. 3 is a diagram of an additional function region according to a second embodiment of the present disclosure. A column of the first dummy pixel driving circuits 141 at the left side of the transparent display region 112 (the column of the first dummy pixel driving circuits 141 located at the side of the $n^{th}$ column of the first pixel driving circuits 13 close to the $(n+1)^{th}$ column of the first pixel driving circuits 13) is electrically connected to the $a^{th}$ data line corresponding to the $a^{th}$ column of the first pixel driving circuits 13 at the same side of the transparent display region. Here, the number a is greater than or equal to (n−1). When a=n−1, a column of the first dummy pixel driving circuits 141 at the left side of the transparent display region 112 is electrically connected to the $(n−1)^{th}$ data line corresponding to the $(n−1)^{th}$ column of the first pixel driving circuits 13. Here, the number a could be (n−2) or (n−3).

A column of the second dummy pixel driving circuits 142 at the right side of the transparent display region 112 (the column of the second dummy pixel driving circuits 142 located at the side of the $(n+1)^{th}$ column of the first pixel driving circuits 13 close to the $n^{th}$ column of the first pixel driving circuits 13) is electrically connected to the $b^{th}$ data line corresponding to the $b^{th}$ column of the first pixel driving circuits 13. Here, the number b is greater than or equal to (n+2) and smaller than or equal to m. When b=(n+2), a column of the second dummy pixel driving circuits 142 at the right side of the transparent display region 112 is electrically connected to the $(n+2)^{th}$ data line corresponding to the $(n+2)^{th}$ column of the first pixel driving circuits 13. Here, the number b could be (n+3) or (n+4).

Please refer to FIG. 4. FIG. 4 is a diagram of an additional function region according to a third embodiment of the present disclosure. Two adjacent columns of the first dummy pixel driving circuits 141 are placed at the right side of the $n^{th}$ column of the first pixel driving circuits 13. The two columns of the first dummy pixel driving circuits 141 are respectively electrically connected to the $(n+1)^{th}$ data line corresponding to the $(n+1)^{th}$ column of the first pixel driving circuits 13 and the $(n+2)^{th}$ data line corresponding to the $(n+2)^{th}$ column of the first pixel driving circuits 13. Two adjacent columns of the second dummy pixel driving circuits 142 are similarly placed at the left side of the $(n+1)^{th}$ column of the first pixel driving circuits 13. The two adjacent columns of the second dummy pixel driving circuits 142 are respectively electrically connected to the $n^{th}$ data line 16 and the $(n+1)^{th}$ data line 16.

In the actual implementation, the number of columns of the dummy pixel driving circuits 14 placed at the right side of the $n^{th}$ column of the first pixel driving circuits 13 and at the left side of the $(n+1)^{th}$ column of the first pixel driving circuits 13 is not limited to one or two as previously mentioned. The number could be three or more.

Figure 5:
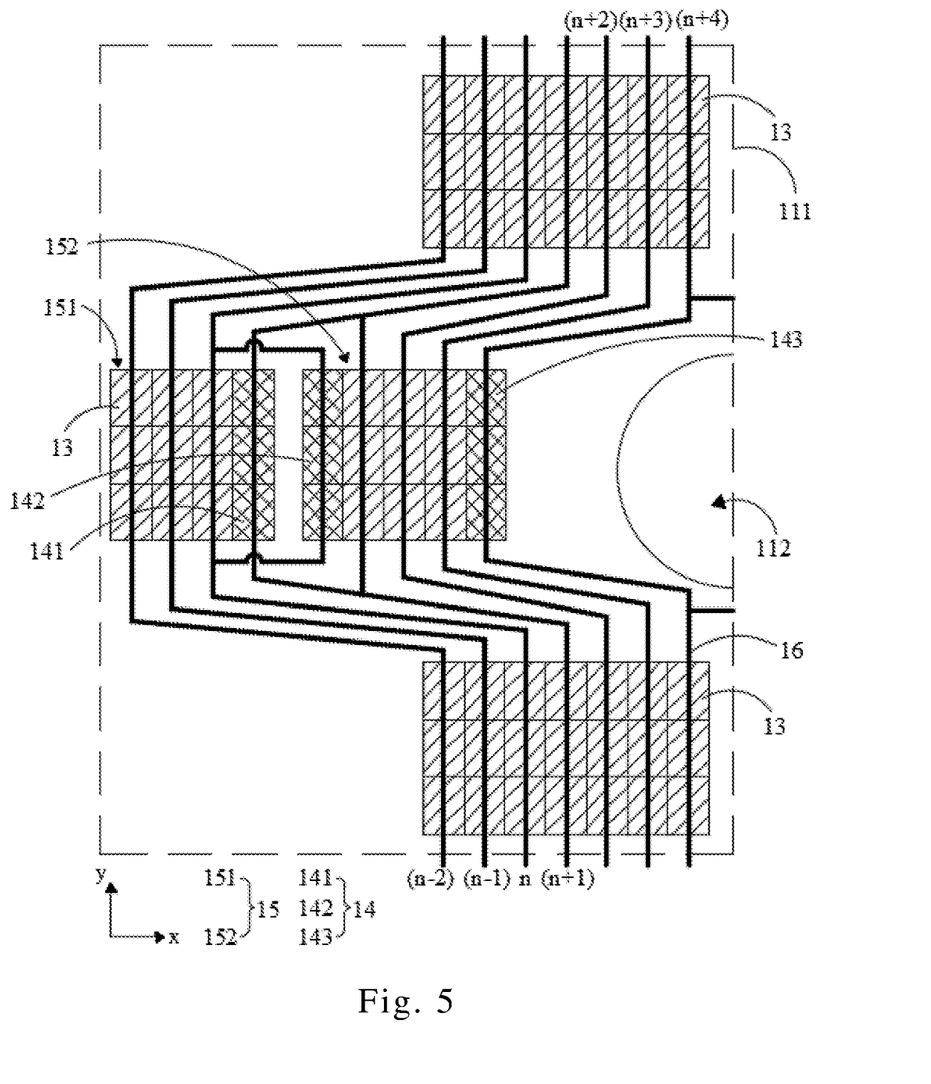
FIG. 5 is a diagram of an additional function region according to a fourth embodiment of the present disclosure.

Please refer to FIG. 5. FIG. 5 is a diagram of an additional function region according to a fourth embodiment of the present disclosure. As shown in FIG. 5, the transition display region 111 has a plurality of pixel driving circuit islands 15 arranged in an interval distribution. Each of the pixel driving circuit islands 15 comprises multiple first pixel driving circuits 13. The distance between adjacent pixel driving islands is greater than the predetermined distance. A corresponding column of the dummy pixel driving circuits 14 is placed at one side edge of a pixel driving circuit island 15 along the second direction, where the side edge of the pixel driving circuit island along the second direction is closer to its adjacent pixel driving circuit 14.

Each of the pixel driving circuit islands 15 is formed by collecting multiple first pixel driving circuits 13 in the island. In contrast to the conventional art having the first pixel driving circuits 13 scattered (one sub-pixel corresponds to a driving circuit), the pixel driving circuits 13 here are more concentrated.

FIG. 5 merely depicts two adjacent pixel driving circuit islands, the first pixel driving circuit island 151 and the second pixel driving circuit island 152. The first pixel driving circuit island 151 comprises the $(n−2)^{th}$, the $(n−1)^{th}$, the $n^{th}$ first pixel driving circuits 13. The second pixel driving circuit island 152 comprises the $(n+1)^{th}$, the $(n+2)^{th}$, the $(n+3)^{th}$ first pixel driving circuits 13. The distance between the first pixel driving circuit island 151 and the second pixel driving circuit island 152 is greater than two adjacent columns of the first pixel driving circuits 13 to ensure the edges of the first pixel driving circuit island 151 and the second pixel driving circuit island 152 have enough space to place the dummy pixel driving circuits 14.

A column of the first dummy pixel driving circuits 141 is placed at one side of the first pixel driving circuit island 151 along the second direction, where the side of the first pixel driving circuit island 151 is close to the second pixel driving circuit island 152. The $n^{th}$ column of the first pixel driving circuits 13 in the first pixel driving circuit island 151 is the column closest to the second pixel driving circuit island 152. The $n^{th}$ column of the first pixel driving circuits 13 and an adjacent column of the first dummy pixel driving circuits 141 are respectively electrically connected to the $n^{th}$ data line and the $(n+1)^{th}$ data line. In this way, the $n^{th}$ column of the first pixel driving circuits 13 at the edge of the first pixel driving circuit island 151 and the other columns of the first pixel driving circuits 13 in the first pixel driving circuit island 151 could have similar environments. This could reduce the luminance difference between the first display pixels controlled by the $n^{th}$ column of the first pixel driving circuits 13 and the first display pixels controlled by the other columns of the first pixel driving circuits 13 in the first pixel driving circuit island 151.

A column of the second dummy pixel driving circuits 142 is placed at one side of the second pixel driving circuit island 152 along the second direction, where the side of the second pixel driving circuit island 152 is close to the first pixel driving circuit island 151. The $(n+1)^{th}$ column of the first pixel driving circuits 13 in the second pixel driving circuit island 152 is the column closest to the first pixel driving circuit island 151. The $(n+1)^{th}$ column of the first pixel driving circuits 13 and an adjacent column of the second dummy pixel driving circuits 142 are respectively electrically connected to the $(n+1)^{th}$ data line and the $n^{th}$ data line.

A column of the third dummy pixel driving circuits 143 at one edge is placed at one side of the second pixel driving circuit island 152, which is close to the transparent display region 112. The third dummy pixel driving circuits 142 are placed between the $(n+3)^{th}$ column of the first pixel driving circuits 13 and the transparent display region 112. The $(n+3)^{th}$ column of the first pixel driving circuits 13 is electrically connected to the $(n+3)^{th}$ data line. The column of the third dummy pixel driving circuits 143 is electrically connected to the $(n+4)^{th}$ data line. In this way, the $(n+1)'$h column and the $(n+3)^{th}$ column of the first pixel driving circuits 13 at the edge of the second pixel driving circuit island 152 and the other columns of the first pixel driving circuits 13 in the second pixel driving circuit island 152 could have similar environments. This could reduce the luminance difference between the first display pixels controlled by the $(n+1)^{th}$ column and the $(n+3)^{th}$ column of the first pixel driving circuits 13 and the first display pixels controlled by the other columns of the first pixel driving circuits 13 in the second pixel driving circuit island 152.

According to an embodiment, an electronic device is disclosed. The electronic device comprises an optical sensor and the above-mentioned display panel.

According to an embodiment, a display panel and an electronic device are disclosed. The display panel includes an additional function region. The additional function region comprises a transition display region and a transparent display region. The transition display region is placed in a peripheral region of the transparent display region. The transition display region has a plurality of first pixel driving circuits and a plurality of dummy pixel driving circuits. Each of the plurality of first pixel driving circuits is electrically connected to at least one corresponding first display pixel. In each column of first pixel driving circuits, a first pixel driving circuit or a dummy pixel driving circuit is adjacently placed within a predetermined distance from at least one side of at least part of the first pixel driving circuits arranged along the second direction. This could reduce the environment difference between the pixel driving circuit close to the light sensing region and the pixel driving circuit inside the transition display region and thus reduce the luminance difference between the first display pixels controlled by the pixel driving circuit close to the light sensing region and the first display pixels controlled by the pixel driving circuit inside the transition display region. Accordingly, the display panel and the electronic device could solve the issue of uneven luminance in the additional function region.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, having an additional function region that comprises a transition display region and a transparent display region, the transition display region placed in a peripheral region of the transparent display region, the display panel comprising:
   a plurality of display pixels, placed in the transition display region and the transparent display region;
   a plurality of first pixel driving circuits, placed in the transition display region, each of the plurality of first pixel driving circuits is electrically connected to at least one corresponding first display pixel of the plurality of display pixels;
   a plurality of dummy pixel driving circuits, placed in the transition display region; and
   a plurality of data lines, extending along the first direction and distributed along the second direction; wherein a part of the plurality of dummy pixel driving circuits located in a same column is electrically connected to a same data line, a column of the dummy pixel driving circuits and an adjacent column of the first pixel driving circuits are respectively electrically connected to two adjacent data lines;
   wherein the plurality of first pixel driving circuits extend along a first direction as columns, the columns of the first pixel driving circuits are arranged along a second direction, and the first direction and the second direction are different;
   wherein in each of the columns of the first pixel driving circuits, a first pixel driving circuit or a dummy pixel driving circuit is adjacently placed within a predetermined distance from at least one side of at least part of the first pixel driving circuits arranged along the second direction;
   wherein the plurality of dummy pixel driving circuits extend along the first direction as a column, at least one column of the dummy pixel driving circuits is adjacently placed within a predetermined distance from a side of at least two columns of a plurality of columns of first pixel driving circuits arranged along the second direction;
   wherein the transition display region has a plurality of pixel driving circuit islands arranged in an interval distribution, each of the pixel driving circuit islands comprises multiple first pixel driving circuits;
   wherein a distance between two adjacent pixel driving circuit islands is greater than the predetermined distance, a corresponding column of the dummy pixel driving circuits is placed at one side edge of a pixel driving circuit island along the second direction, where the side edge of the pixel driving circuit island along the second direction is closer to its adjacent pixel driving circuit;
   wherein a column of the first pixel driving circuits in the pixel driving circuit island closest to its adjacent pixel driving circuit and a corresponding dummy pixel driving circuit are respectively electrically connected to two adjacent data lines.

2. The display panel of claim 1, wherein the transition display region has m first pixel driving circuits and m data lines, an $n^{th}$ column of the first pixel driving circuits is electrically connected to an $n^{th}$ data line;
   wherein a column of the dummy pixel driving circuits is placed within a predetermined distance from one side of the $n^{th}$ column of the first pixel driving circuits, the dummy pixel driving circuits are electrically connected to a data line other than the $n^{th}$ data line, wherein n is greater than or equal to 1 and is smaller than or equal to m.

3. The display panel of claim 2, wherein the plurality of dummy pixel driving circuits comprises a first dummy pixel driving circuit and a second dummy pixel driving circuit;
   wherein a column of the first dummy pixel driving circuit is placed at a side of the $n^{th}$ column of the first pixel driving circuit close to an $(n+1)^{th}$ column of the first pixel driving circuits, the first dummy pixel driving circuit is electrically connected to an $a^{th}$ data line;
   wherein a column of the second dummy pixel driving circuit is placed at a side of the $(n+1)^{th}$ column of the first pixel driving circuit close to the $n^{th}$ column of the first pixel driving circuit, the second dummy pixel driving circuit is electrically connected to a $b^{th}$ data line; and
   wherein n is greater than or equal to (m−1), a is greater than or equal to (n+1) and b is smaller than or equal to n.

4. The display panel of claim 3, wherein each column of the first and second dummy pixel driving circuits and its adjacent column of the first pixel driving circuits are respectively electrically connected to adjacent data lines, wherein a is equal to (n+1) and b is equal to n.

5. The display panel of claim 2, wherein the plurality of dummy pixel driving circuit comprises a first dummy pixel driving circuit and a second dummy pixel driving circuit;

wherein a column of the first dummy pixel driving circuits is placed at a side of the $n^{th}$ column of the first pixel driving circuit close to an $(n+1)^{th}$ column of the first pixel driving circuit, the first dummy pixel driving circuit is electrically connected to an $a^{th}$ data line;

wherein a column of the second dummy pixel driving circuit is placed at a side of the $(n+1)^{th}$ column of the first pixel driving circuit close to the $n^{th}$ column of the first pixel driving circuit, the second dummy pixel driving circuit is electrically connected to a $b^{th}$ data line; and wherein n is greater than or equal to (m−1), a is smaller than or equal to (n−1) and b is greater than or equal to (n+2).

6. The display panel of claim 5, wherein each column of the first and second dummy pixel driving circuits and its adjacent column of the first pixel driving circuits are respectively electrically connected to adjacent data lines, wherein a is equal to (n−1) and b is equal to (n+2).

7. The display panel of claim 1, wherein each of the first pixel driving circuits is electrically connected to a plurality of the first display pixels.

8. The display panel of claim 1, wherein along the second direction, a corresponding column of the dummy driving circuits is placed between a column of the first pixel driving circuits in the transition display region closest to the transparent display region and the transparent display region;

wherein a column of the first pixel driving circuits in the transition display region closest to the transparent display region and a corresponding column of the dummy pixel driving circuits are respectively electrically connected to two adjacent data lines.

9. The display panel of claim 8, wherein along the second direction, a column of the dummy pixel driving circuits placed at one side of the transparent display region is electrically connected to a data line corresponding to a column of the first pixel driving circuits placed at another side of the transparent display region.

10. The display panel of claim 9, along the second direction, a column of the dummy pixel driving circuits placed at one side of the transparent display region is electrically connected to a data line corresponding to a column of the first pixel driving circuits placed at another side of the transparent display region closest to the transparent display region.

11. The display panel of claim 10, wherein the first pixel driving circuits and the first display pixels are one-by-one electrically connected to each other.

12. The display panel of claim 1, wherein the display panel has a main display region placed in a peripheral region of the additional function region, and the display panel further comprises:

a plurality of second display pixels, placed in the main display region; and a plurality of second pixel driving circuits, placed in the main display region, the second pixel driving circuits are electrically connected to the corresponding second display pixels;

wherein a density of the first pixel driving circuits in the transition display region is greater than a density of the second pixel driving circuits in the main display region.

13. An electronic device, comprising an optical sensor and a display panel having an additional function region that comprises a transition display region and a transparent display region, the transition display region placed in a peripheral region of the transparent display region, the display panel comprising:

a plurality of display pixels, placed in the transition display region and the transparent display region;

a plurality of first pixel driving circuits, placed in the transition display region, each of the plurality of first pixel driving circuits is electrically connected to at least one corresponding first display pixel of the plurality of display pixels;

a plurality of dummy pixel driving circuits, placed in the transition display region; and a plurality of data lines, extending along the first direction and distributed along the second direction; wherein a part of the plurality of dummy pixel driving circuits located in a same column is electrically connected to a same data line, a column of the dummy pixel driving circuits and an adjacent column of the first pixel driving circuits are respectively electrically connected to two adjacent data lines;

wherein the plurality of first pixel driving circuits extend along a first direction as columns, the columns of the first pixel driving circuits are arranged along a second direction, and the first direction and the second direction are different;

wherein in each of the columns of the first pixel driving circuits, a first pixel driving circuit or a dummy pixel driving circuit is adjacently placed within a predetermined distance from at least one side of at least part of the first pixel driving circuits arranged along the second direction;

wherein the transition display region has m first pixel driving circuits and m data lines, an $n^{th}$ column of the first pixel driving circuits is electrically connected to an $n^{th}$ data line;

wherein a column of the dummy pixel driving circuits is placed within a predetermined distance from one side of the $n^{th}$ column of the first pixel driving circuits, the dummy pixel driving circuits are electrically connected to a data line other than the $n^{th}$ data line, wherein n is greater than or equal to 1 and is smaller than or equal to m;

wherein the plurality of dummy pixel driving circuits comprise a first dummy pixel driving circuit and a second dummy pixel driving circuit;

wherein a column of the first dummy pixel driving circuits is placed at a side of the $n^{th}$ column of the first pixel driving circuit close to an $(n+1)^{th}$ column of the first pixel driving circuit, the first dummy pixel driving circuit is electrically connected to an $a^{th}$ data line;

wherein a column of the second dummy pixel driving circuit is placed at a side of the $(n+1)^{th}$ column of the first pixel driving circuit close to the $n^{th}$ column of the first pixel driving circuit, the second dummy pixel driving circuit is electrically connected to a $b^{th}$ data line; and wherein n is greater than or equal to m−1, a is greater than or equal to n+1 and b is smaller than or equal to n.

14. The electronic device of claim 13, wherein each column of the first and second dummy pixel driving circuits and its adjacent column of the first pixel driving circuits are respectively electrically connected to adjacent data lines, wherein a is equal to n+1 and b is equal to n.

* * * * *